United States Patent
Corio

(10) Patent No.: US 6,175,254 B1
(45) Date of Patent: Jan. 16, 2001

(54) SYSTEM FOR COMPENSATING A SIGNAL FOR AN OFFSET FROM A REFERENCE LEVEL

(75) Inventor: Mark A. Corio, Rochester, NY (US)

(73) Assignee: Rochester MicroSystems, Inc., Rochester, NY (US)

(*) Notice: Under 35 U.S.C. 154(b), the term of this patent shall be extended for 0 days.

(21) Appl. No.: 09/240,750

(22) Filed: Jan. 29, 1999

Related U.S. Application Data

(60) Provisional application No. 60/073,720, filed on Feb. 4, 1998.

(51) Int. Cl.[7] .................................................... H03K 5/159
(52) U.S. Cl. ...................................... 327/94; 327/307
(58) Field of Search ............................... 327/306, 307, 327/362, 94, 91, 95, 96; 330/11

(56) References Cited

U.S. PATENT DOCUMENTS

| 3,684,378 | 8/1972 | Lord | 702/85 |
|---|---|---|---|
| 3,846,710 | 11/1974 | Chapman | 434/166 |
| 4,553,848 | 11/1985 | Rosicke et al. | 356/448 |
| 5,396,123 | * 3/1995 | Minamizaki | 327/307 |
| 5,675,517 | 10/1997 | Stokdijk | 356/323 |

* cited by examiner

Primary Examiner—Dinh T. Le
(74) Attorney, Agent, or Firm—Nixon Peabody LLP

(57) ABSTRACT

An electronic circuit provides automatic compensation with reduced errors of undesirable offsets in analog and digital signals, including offsets in the input signal and offsets due to tolerances in components comprising said electronic circuit. The electronic circuit includes a minimum-hold circuit or, depending on the polarity of the signal of interest, a maximum-hold circuit to continuously determine the at-rest, or reference level of the input signal. The accuracy of compensation is therefore not a function of the duty cycle or amplitude of the input signal of interest.

21 Claims, 4 Drawing Sheets

SYSTEM FOR COMPENSATING A SIGNAL FOR AN OFFSET FROM A REFERENCE LEVEL

This application claims the benefit of U.S. Provisional Patent Application Serial No. 60/073,720 filed on Feb. 4, 1998 which is herein incorporated by reference.

FIELD OF THE INVENTION

This invention relates generally to correction circuitry and, more particularly, to a circuit for compensating a signal for an offset from a reference level.

BACKGROUND OF THE INVENTION

Diverse electronic systems are intended for accurately measuring the amplitude of signals from sensors and other sources. Many signal processing circuits, such as amplifiers and signal transmission circuits, introduce undesirable offsets into signals of interest. To deal with this problem, certain electronic components, e.g., operational amplifiers, have offset nulling means built in to compensate for these inherent errors.

In many instances the input signal itself may have some offset or background level, in which cases the desired information is the amplitude of signals relative to that off-set or background level. This is often the case when monitoring an environment when signals are generated by sensors in response to environmental changes, such as light intensities, temperature, flow, etc. In such cases the desired information is the variation from normal or ambient conditions, rather than the absolute amplitude value of the variable.

In other situations an offset is intentionally added to the signal of interest to facilitate processing of the signal. This, for instance, is the case when analog signals are being processed by electronic circuits powered from a single supply which may not allow the signal level to vary beyond the voltage value of the supply. To process a signal with this type of circuitry, an offset, often equal to half the magnitude of the supply voltage, is added to the signal in the initial circuit stages. This offset is then often required to be removed after the processing has been completed.

In order to make accurate measurements of the signal, a means for removing the above described and other offsets, is desired. There are many known means for removing such offsets and restoring the reference level or the baseline of the signal. Some of these have been disclosed in the referenced prior art.

If the offset is of a known and constant magnitude, it can be compensated for by adding to the signal a constant (DC) voltage of a polarity opposite to that of the offset, with the result that the amplitude of the signal of interest will be referenced to zero or some other desired level. This correction can be accomplished with a summing amplifier combining the necessary DC off-set with the input signal.

In cases when the offsets to be removed are constant in a time frame relative to the measurements to be made, but vary between the measurements, these offsets can be eliminated by manual adjustment of the level of the compensating signal to be injected.

A well-known technique is frequently used to deal with offsets automatically. To effectively apply this technique, the offsets should be static or varying on a time scale significantly longer than that of the desired signal. In this approach, the input signal is directed to a low-pass filter, the output of which is a constant or a slow varying (relative to the measurement time scale) DC signal. The output from the low-pass filter is subsequently subtracted from the original signal to remove the offset as described in U.S. Pat. No. 3,846,710 to Chapman, which is herein incorporated by reference. This method provides continuous compensation (i.e., removal) of the offset.

The baseline restoration of the signal using the preceding technique is adequate for applications where the required relative accuracy of signal amplitude measurements is low, e.g., digital signals or signals with very low duty cycles. For signals of higher duty cycles, significantly varying amplitudes, and/or signals that require extreme accuracy in measuring their amplitude, this approach is limited by errors in signal restoration.

The output of the low-pass filter nominally represents the average value of the signal. With very low duty cycle signals, this average very closely approximates the offset from zero, or reference, level. As the duty cycle of the signal increases, the time interval when the amplitude of the signal is not zero, also increases. Consequently, the accuracy with which the average signal coming from the low-pass filter approximates the ideal compensation level is reduced in relation to the increase in the signal duty cycle. Likewise, significant variation in the amplitude of the input signal results in a similar variation in the average value of the compensating signal, also producing errors for this type of signals.

In those cases when the duty cycle and/or signal amplitude variations are fairly constant over the time scale of the measurements, the residual error from compensation schemes using low-pass filters may be reduced or eliminated by the addition of a manual compensation to the signal following the automatic baseline restoration. Such manually injected compensating signal would be equal in amplitude but of opposite polarity of the residual offset. One such approach is described in U.S. Pat. No. 5,675,517 to Stokdijk, which is herein incorporated by reference. The compensating circuit disclosed in that patent, however, still leaves residual errors for signals which have varying duty cycles and/or amplitudes.

In some systems where the signal pulses of interest are related in a synchronous manner to a known clock source, the reference level may be sampled between the pulses of interest, i.e., when the signal is known to be at the reference level. This level is then extracted and stored for use in measuring the amplitude of the following desired signal pulse(s) by a switching system which connects the input signal to a level storage device, such as a capacitor, during the reference period between said pulses. This stored value is then used as the reference level for the measurement by subtracting it from the input signal prior to the measurement, or by other means. This type of approach is described for example by U.S. Pat. No. 3,684,378 to Lord, and by U.S. Pat. No. 4,553,848 to Rosicke et al. which are herein incorporated by reference in various applications. As mentioned, this compensation scheme is limited to situations where the signals of interest arrive at the input at a known time in a manner synchronous with a known clock signal. This approach, however, is of little value where signals arrive at the input of a measurement system randomly, as is the case, for instance, with flow cytometry apparatus and other particle detection systems.

SUMMARY OF THE INVENTION

A circuit for compensating a positive input signal for an offset from a reference level in accordance with one embodiment of the present invention includes a minimum sense-and-hold circuit and a correction circuit. The minimum sense-and-hold circuit senses the positive input signal and holds a compensation signal which represents a minimum value for the sampled portion of the positive input signal. The correction circuit has an input which receives the positive input signal and the compensation signal. The correction circuit uses the compensation signal to remove the offset from the positive input signal.

A circuit for compensating a negative input signal for an offset from a reference level in accordance with another embodiment of the present invention includes a maximum sense-and-hold-circuit and a correction circuit. The maximum sense-and-hold circuit senses the negative input signal and holds a compensation signal which represents a maximum value for the sampled portion of the negative input signal. The correction circuit has an input which receives the negative input signal and the compensation signal. The correction circuit uses the compensation signal to remove the offset from the negative input signal.

A circuit for compensating an input signal for an offset from a reference level in accordance with yet another embodiment of the present invention includes a sense-and-hold-circuit and a correction circuit. The sense-and-hold circuit senses the input signal and holds a compensation signal which represents the offset for the sampled portion of the input signal. The correction circuit has an input which receives the input signal and the compensation signal. The correction circuit uses the compensation signal to remove the offset from the input signal.

The present invention provides a superior means for automatically removing signal off-sets and restoring the signal reference level to zero or any other selected reference level. One of the advantages of the present invention is that the average value of the input signal is not used to determine the magnitude of the compensating signal. Another advantage is that the present invention is unaffected by variations in the average duty cycle or average amplitude of the input signal. As a result, the present invention is more accurate and may be used in a wider variety of applications than prior compensation circuitry.

By way of example, with the present invention the baseline level of the input signal is determined by the function of the minimum-hold circuit which has a time constant significantly longer than the time between the occurrences of components of interest in the input signal. The compensating minimum signal generated by the minimum-hold circuit is subtracted from the input signal and the resulting, compensated input signal is accurately referenced to the zero or ground level. If a reference level other than zero is desired, an additional DC signal may be injected into the input signal concurrent with or subsequent to the subtraction of the compensating minimum signal. A difference amplifier, a summing amplifier or other means or method familiar to one of ordinary skill in the art can be used for combining the compensating signal with the original input signal. Any offset errors that my be introduced into the signal of interest by the circuits used in this signal processing may be removed using gain adjustment circuitry because these offset errors are static in nature. Although this example of the present invention is intended for processing of input signals that are positive with respect to a baseline level. The present invention may be modified to process input signals that are negative with respect to a baseline level. Basically, the only modification that needs to be made is the substitution of a maximum sense-and-hold circuit in place of the minimum sense-and-hold circuit. All of the other components and the topology will remain the same.

DETAILED DESCRIPTION

Figure 1:
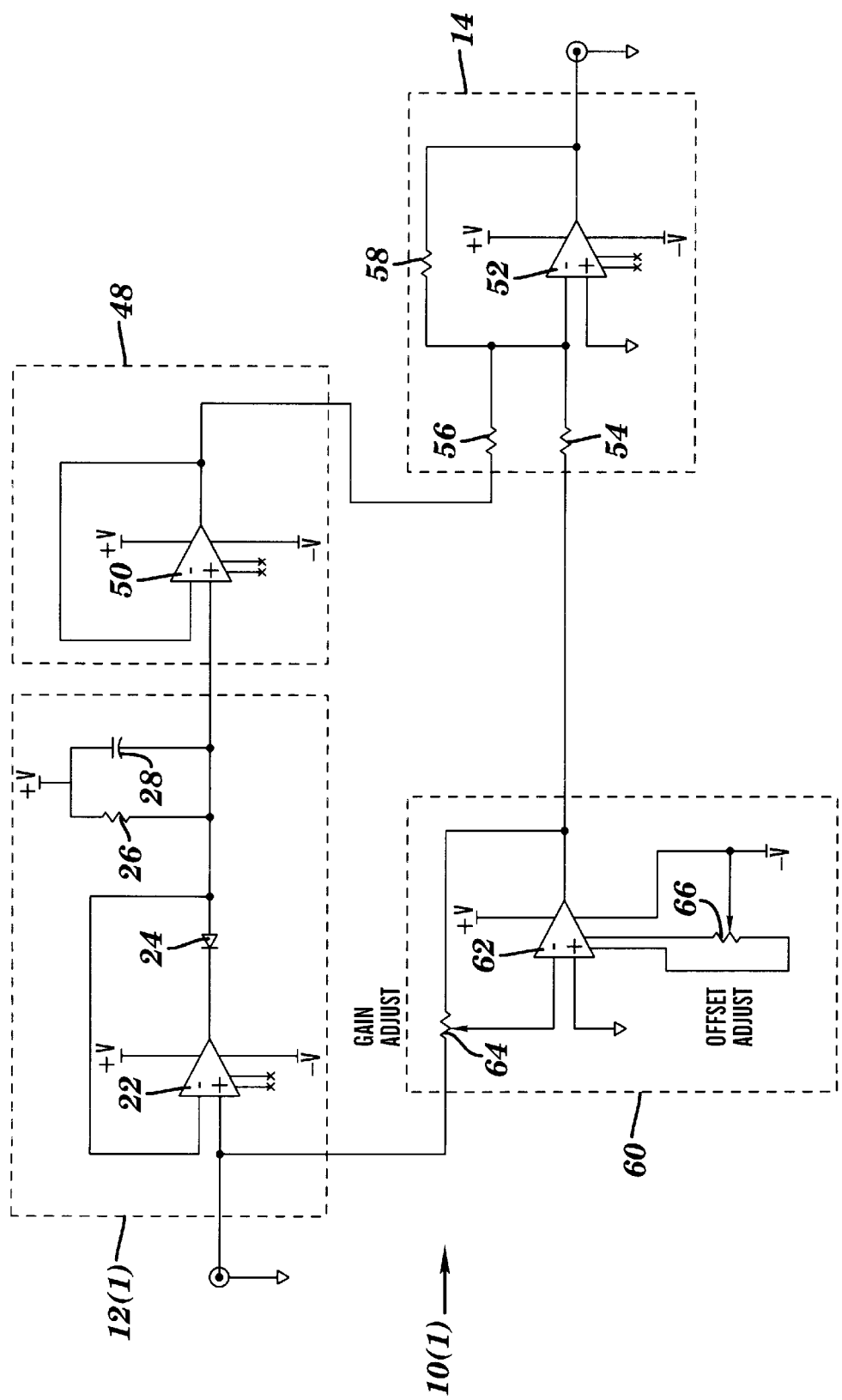
FIG. 1 is a diagram of a circuit for compensating a positive input signal for an offset from a reference level in accordance with one embodiment of the present invention.
Figure 2:
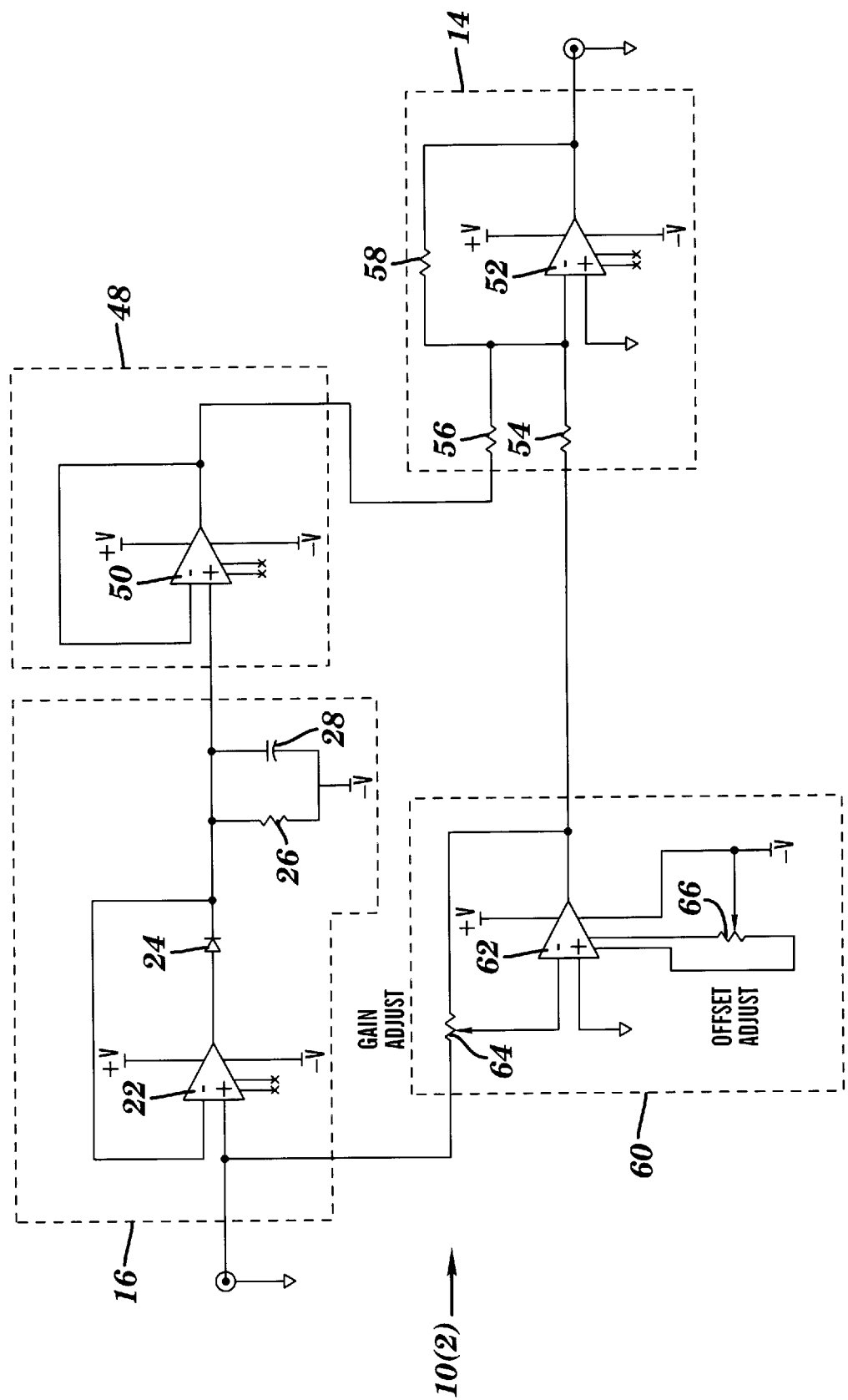
FIG. 2 is a diagram of a circuit for compensating a negative input signal for an offset from a reference level in accordance with another embodiment of the present invention.

A circuit 10(1) for compensating a positive input signal 20 for an offset or offsets OL from a reference level in accordance with one embodiment of the present invention is illustrated in FIG. 1. The circuit 10(1) includes a minimum sense-and-hold-circuit 12(1) and a correction circuit 14. As shown in FIG. 2, the circuit 10(1) can be modified to compensate a negative input signal for an offset OL from a reference level by substituting a maximum sense-and-hold circuit 16 for the minimum sense-and-hold circuit 12(1). The present invention provides a circuit 10(1) that does not need to use the average value of the input signal 20 (shown in FIG. 3A) to determine the magnitude of the compensating signal 18 and is unaffected by variations in the average duty cycle or average amplitude of the input signal 20. As a result, the present invention is more accurate and may be used in a wider variety of applications than prior compensation circuitry.

Referring to FIG. 1, the minimum sense-and-hold circuit 12(1) is able to sense and hold a compensating signal 18 which represents the offset or offsets OL of the input signal 20 above a baseline, e.g. ground or zero. In this particular embodiment, the minimum sense-and-hold circuit 12(1) includes an operational amplifier 22, a diode 24, a resistor 26 and a capacitor 28, although other types of components can be used as needed or desired. The operational amplifier 22 is configured as a voltage follower. The non-inverting input or terminal of the operational amplifier 22 receives the positive input signal 20 and the inverting terminal or input is coupled to the anode of the diode 24. The output of the operational amplifier 22 is coupled to the cathode of the diode 24. As a result, the output of the diode 24 is fed directly back into the inverting terminal of the operational amplifier 22. The operational amplifier 22 is also coupled to a positive power supply +V and to a negative power supply −V. The resistor 26 is coupled between the positive voltage source +V and the anode of the diode 24. The capacitor 28 is coupled in parallel to the resistor 26.

Figure 4A:
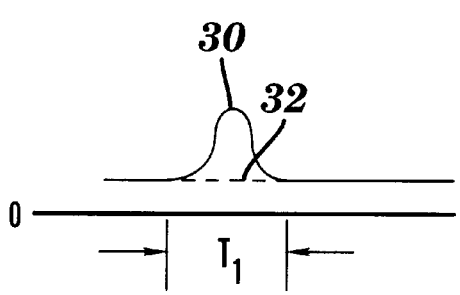
FIGS. 4A–4B are diagrams illustrating other examples of the input signal and compensation signal in a sense-and-hold circuit in accordance with the present invention.
Figure 4B:
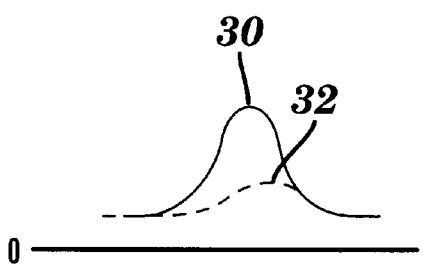

The resistor 26 and the capacitor 28 determine the time constant of the minimum sense-and-hold circuit 12(1) and thus its hold and decay properties. The particular values of the resistor 26 and the capacitor 28 are selected so that the hold time of the minimum sense-and-hold circuit 12(1) ensures the desired accuracy for the width of the component of interest in the input signal and the variations of the offset or offsets OL in the input signal. As shown in FIG. 4A, the portion of the input signal 30 of interest has a width of $T_1$ and the particular values of the resistor 26 and the capacitor 28 for the sense-and-hold circuit have been selected so that the time constant is sufficiently longer than $T_1$. As a result, the compensation signal 32 (shown as the dashed line in FIG. 4A) does not begin to follow the input signal 30 (shown as the solid line in FIG. 4A). By way of example, the time constant is selected to be about ten times larger than the width of the component of interest in the input signal 30 and the variations of the offset or offsets OL in the input signal. However, if the particular values of the resistor and the capacitor for the sense-and-hold circuit were not selected so that the time constant is sufficiently larger than $T_1$, then as shown in FIG. 4B the compensation signal 32 (shown as the dashed line in FIG. 4B) would begin to track the input signal 30 (shown as the solid line in FIG. 4B).

Figure 5:
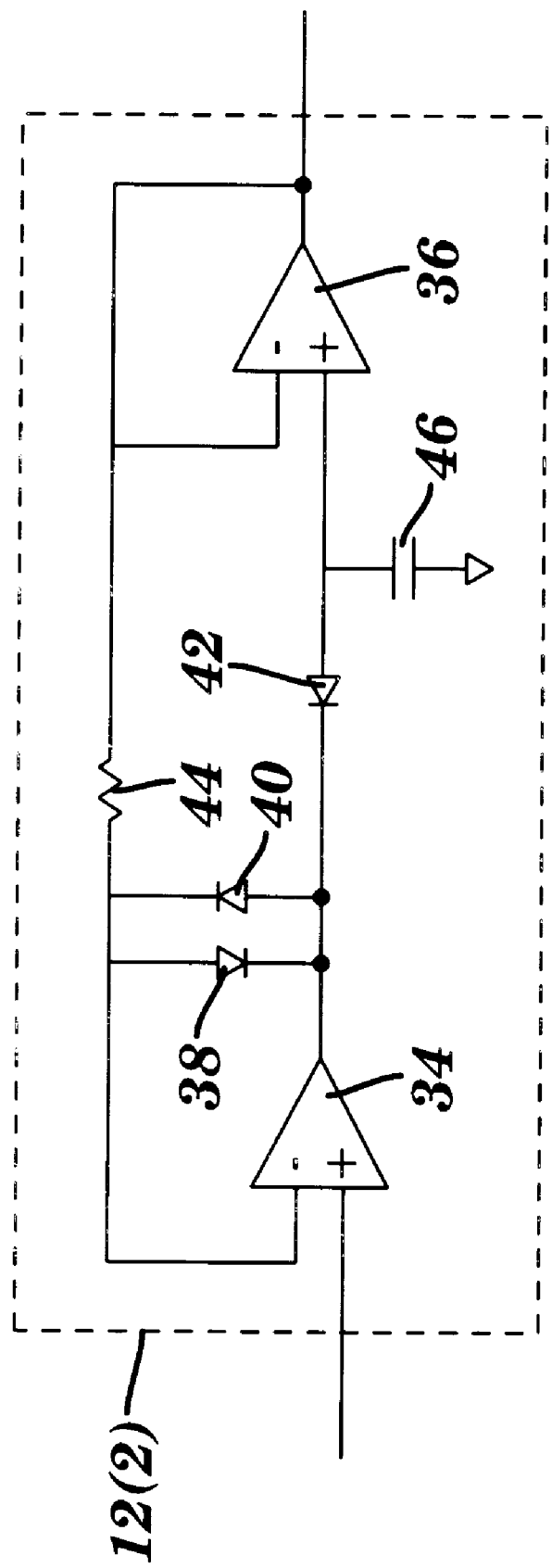
FIG. 5 is a diagram of an alternative embodiment for a minimum sense-and-hold circuit.

Referring to FIG. 5 an alternative embodiment for a minimum sense-and-hold circuit 12(2) is illustrated, although other types of circuits may also be used. In this particular example, the minimum sense-and-hold circuit 12(2) includes a pair of operational amplifiers 34 and 36, diodes 38, 40, and 42, a resistor 44, and a capacitor 46. The non-inverting input of the operational amplifier 34 receives the positive input signal 20. The inverting input of the operational amplifier 34 is coupled to the anode of the diode 38, the cathode of the diode 40, and one lead of the resistor 44. The cathode of the diode 38, the anode of the diode 40, and the cathode of the diode 42 are coupled to the output of the operational amplifier 34. The anode of the diode 42 and the capacitor 46 are coupled to the non-inverting input of the operational amplifier 36. The inverting input of the operational amplifier 36 is coupled to the other lead of the resistor 44 and to the output of the operational amplifier 36. The output of the operational amplifier 36 is the offset level or compensation signal 18 to be removed from the positive input signal 20. The diodes 38 and 40 are included to compensate for the voltage drop of diode 42. The resistor 44 provides feedback to the operational amplifier 34 when the diodes 38 and 40 are not biased. The capacitor 46 holds the signal representative of the minimum of the positive input signal 20 which is the compensation signal 18. The decay time of this minimum sense-and-hold circuit 12(1) is a function of the capacitance of capacitor 46 and the bias and offset currents of the input of the operational amplifier 36.

Referring back to FIG. 1, a buffer circuit 48 is coupled between the output of the minimum sense-and-hold circuit 12(1) and the input of the correction circuit 14 and serves as a buffer for the compensating signal 18 generated by the minimum sense-and-hold circuit 12(1). In this particular embodiment, the buffer circuit 48 is an operational amplifier configured as a voltage follower, although other types of buffer circuitry can be used as needed or desired. The operational amplifier 50 is coupled to the positive power supply +V and to the negative power supply −V. The non-inverting input of the operational amplifier 50 is coupled to the output of the minimum sense-and-hold circuit 12(1) and the inverting terminal is coupled to the output of the operational amplifier 50.

The correction circuit 14 is coupled to the output of the buffer circuit 48 and uses the compensation signal 18 forwarded by the buffer circuit 48 to remove the offset or offsets OL from the input signal 20. In this particular embodiment, the correction circuit 14 is an operational amplifier 52 configured as an inverting summing operational amplifier and three resistors 54, 56, and 58, although other types of correction circuitry could be used, such as an operational amplifier configured as a differential amplifier. The operational amplifier 52 is coupled to the positive power supply +V and the negative power supply −V. The non-inverting input of the operational amplifier 52 is coupled to ground. The inverting input of the operational amplifier 52 is coupled to one lead of each of the resistors 54, 56, and 58. The other lead of the resistor 54 is coupled to a gain adjustment circuit 60, the other lead of the resistor 56 is coupled to the output of the buffer circuit 48, and the other lead of the feedback resistor 58 is coupled to the output of the operational amplifier 52. The values of the resistors 54 and 56 and the value of the feedback resistor 58 determine the gain of the operational amplifier 52.

The gain adjustment circuit 60 is coupled to the input of the minimum sense-and-hold circuit 12(1) and the input of the correction circuit 14 and is used to adjust the gain of the circuit 10(1) and to compensate for the input and off-set errors inherent in the operational amplifiers 22, 50, 52, and 62 used in this circuit. In this particular embodiment, the gain adjustment circuit 60 includes the operational amplifier 62 and a pair of potentiometers 64 and 66, although other types of gain adjustment circuits can be used as needed or desired. The non-inverting input of the operational amplifier 62 is coupled to ground and the inverting input is coupled to one terminal of the potentiometer 64. Another terminal of the potentiometer 64 is coupled to the non-inverting input of operational amplifier 22 and another terminal of the potentiometer 64 is coupled to the output of the operational amplifier 62. The output of the operational amplifier 62 is coupled to the other lead of the resistor 54. The operational amplifier 62 is coupled to the positive power supply +V and to the negative power supply −V. The negative power supply is coupled to one terminal of the potentiometer 66. The other two leads of the potentiometer 66 are coupled to the operational amplifier 62.

Referring to FIG. 2, an alternative embodiment of the present invention for compensating a negative input signal for an offset from a reference level is shown. This compensation circuit 10(2) is identical to the compensation circuit 10(1) it disclosed in FIG. 1, except that minimum sense-and-hold circuit 12(1) is replaced with a maximum sense-and-hold circuit 16 as shown in FIG. 2. More specifically, the maximum sense-and-hold circuit 16 is able to sense and hold a compensating signal which represents the offset or offsets of the input signal with respect to a baseline, e.g. ground or zero. In this particular embodiment, the maximum sense-and-hold circuit 16 includes an operational amplifier 22, a diode 24, a resistor 26 and a capacitor 28, although other types of components can be used as needed or desired. The operational amplifier 22 is configured as a voltage follower. The non-inverting input or terminal of the operational amplifier receives the negative input signal and the inverting terminal or input is coupled to the cathode of the diode 24. The output of the operational amplifier 22 is coupled to the anode of the diode 24. As a result, the output of the diode 24 is fed directly back into the inverting terminal of the operational amplifier 22. The operational amplifier 22 is also coupled to a positive power supply +V and to a negative power supply −V. The resistor 26 is coupled between the negative voltage source −V and the cathode of the diode 24. The capacitor 28 is coupled in parallel to the resistor 26. As discussed earlier, the resistor 26 and the capacitor 28 determine the time constant of the maximum sense-and-hold circuit 16 and thus its hold and decay properties. The particular values of the resistor 26 and the capacitor 28 are selected so that the hold time of the maximum sense-and-hold circuit 16 ensures the desired accuracy for the width of the component of interest in the input signal and the variations of the offset or offsets OL in the input signal. Since the other components in the compensation circuit 10(2) in FIG. 2, their connections, and their operation are identical to those shown in FIG. 1 and described above, they will not be discussed again here.

Figure 3A:
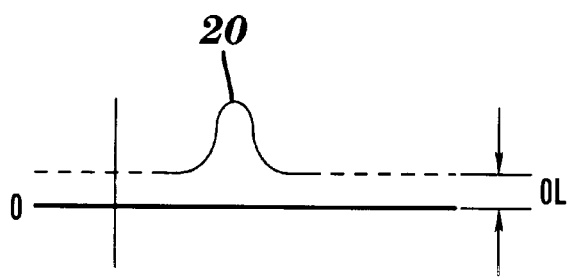
FIGS. 3A–3D are diagrams of one example of the input signal, offset, and compensation signal at various stages in the circuit shown in FIG. 1.
Figure 3B:
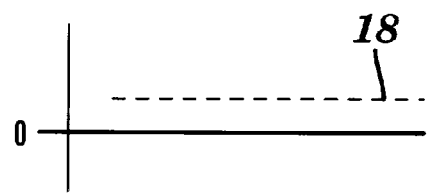

The operation of one embodiment of the circuit 10(1) for compensating a positive input signal for an offset from a reference level will be explained with reference to FIGS. 1 and 3A–3D. As shown in FIGS. 1 and 3A, an input signal 20 (shown as a solid line) has an offset or offsets OL above the ground or other baseline. This input signal 20 is fed into the minimum sense-and hold circuit 12(1) which senses the input signal 20 for a period of time and holds a signal representative of the minimum of the input signal. More specifically, the positive input signal 20 is transmitted to the non-inverting input of the operational amplifier 22 and the output of the diode 24 is fed directly back into the inverting terminal of the operational amplifier 22. The capacitor 28 is charged to and holds the signal representative of the minimum of the input signal which is the compensation signal 18 (shown as a dashed line in FIGS. 3A and 3B). The compensation signal 18 represents the offset or offsets OL to be removed from the positive input signal 20.

Figure 3C:
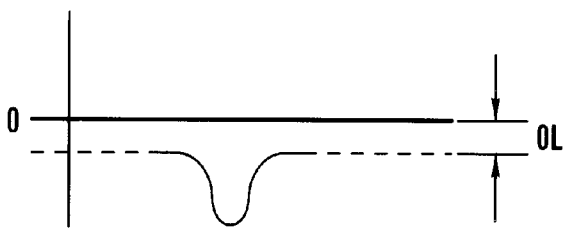

The positive input signal 20 is also directed to the gain adjustment circuit 60 or, more specifically, to one lead or terminal of the potentiometer 64. The output of the potentiometer 64 is injected into the inverting input of the operational amplifier 62. The potentiometer 64 is used to control the gain adjustment of the circuit 10(1) to compensate for gain variations due to components tolerances in this circuit 10(1). Meanwhile, the potentiometer 64 is used to compensate for input and off-set errors inherent in the operational amplifiers 22, 50, 52, and 62 used in this circuit. The resulting output from the gain adjustment circuit 60 has been corrected for any gain adjustments which need to be made and for any offsets introduced by the components of this circuit 10(1). As shown in FIG. 3C, the output of the gain adjustment circuit is an inverted positive input signal with the above noted corrections having been made.

Figure 3D:
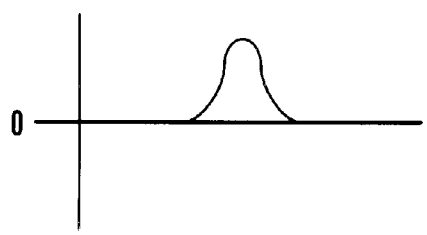

The correction circuit 14 uses the compensation signal 18 to remove the offset OL from the positive input signal 20. More specifically, in this particular embodiment the correction circuit 14 is a summing operational amplifier 52 which combines or sums the compensation signal 18, shown in FIG. 3B, with the inverted positive input signal, shown in FIG. 3C, and outputs the positive input signal with the offset or offsets OL removed, as shown in FIG. 3D. As shown in FIG. 3D, the baseline of the positive input signal is at ground or a zero, the positive input signal could have a different baseline. If a reference level or baseline other than zero is desired, an additional DC signal may be injected into the input signal concurrent with or subsequent to the subtraction of the compensating minimum signal.

Although a summing operational amplifier 52 is used in the correction circuit 14 in this particular example, it would be readily apparent to one of ordinary skill in the art that other types of circuits could be used. For example, an operational amplifier configured as a differential amplifier instead of a summing amplifier could be used in the correction circuit. If an operational amplifier configured as a differential amplifier was used, then the inverted positive input signal, shown in FIG. 3C, would need to be re-inverted before being transmitted to the differential operational amplifier. The differential operational amplifier would then subtract the compensation signal, shown in FIG. 3B, from the re-inverted positive input signal to remove the offset or offsets from the positive input signal, as shown in FIG. 3D.

As this example illustrates, the present invention provides a superior means for automatically removing signal off-sets and restoring the signal reference level to zero or any other selected reference level. Unlike prior compensation circuits discussed earlier, the present invention does not need to determine the average value of the input signal 20 to determine the magnitude of the compensating signal 18 and thus does not have the errors which inherently result from this technique. Additionally, unlike prior compensation circuits, the present invention is unaffected by variations in the average duty cycle or average amplitude of the input signal. As a result, the present invention is more accurate and may be used in a wider variety of applications.

The operation of the circuit 10(2) shown in FIG. 2 is identical to that shown in FIG. 1 and described above, except that a negative input signal would be supplied initially and the signals shown in FIGS. 3A–3D would all be inverted. Since the operation would be identical, except for the difference noted above, the operation of the circuit shown in FIG. 2 will not be described here.

Having thus described the basic concept of the invention, it will be rather apparent to those skilled in the art that the foregoing detailed disclosure is intended to be presented by way of example only, and is not limiting. Various alternations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. A circuit for compensating a positive input signal for an offset from a reference level, the circuit comprising:

a minimum sense-and-hold circuit having an input and an output, the minimum sense-and-hold circuit sampling a portion of the positive input signal from the input, determining a minimum value for the sampled portion of the positive input signal, and holding the minimum value of the portion of the positive input signal as a compensation signal; and a correction circuit which removes the compensation signal from the positive input signal.

2. The circuit as set forth in claim 1 wherein the minimum sense-and-hold circuit comprises:

an operational amplifier configured as a voltage follower;

a diode with a cathode coupled to an output of the voltage follower;

a capacitor coupled between a positive power supply and the anode of the diode; and a resistor coupled in parallel to the capacitor.

3. The circuit as set forth in claim 2 wherein the resistor and the capacitor determine a time constant for the minimum sense-and-hold circuit, the time constant being larger than a width of a pulse in the positive input signal for one duty cycle.

4. The circuit as set forth in claim 1 wherein the correction circuit comprises an operational amplifier.

5. The circuit as set forth in claim 1 further comprising a buffer circuit coupled between the sense-and-hold circuit and the correction circuit.

6. The circuit as set forth in claim 5 wherein the buffer circuit comprises an operational amplifier configured as a non-inverting voltage follower.

7. The circuit as set forth in claim 1 further comprising a gain adjustment circuit coupled to the input of the correction circuit.

8. The circuit as set forth in claim 1 wherein the minimum sense-and-hold circuit comprises:

a first operational amplifier with a non-inverting input for receiving the positive input signal;

a first diode with an anode coupled to the inverting input of the first operational amplifier and a cathode coupled to the output of the first operational amplifier;

a second diode with a cathode coupled to the inverting input of the first operational amplifier and an anode coupled to the output of the first operational amplifier;

a third diode with a cathode coupled to the output of the first operational amplifier;

a resistor with one lead coupled to the inverting input of the operational amplifier;

a second operational amplifier with a non-inverting input coupled to the anode of the third diode and an inverting input coupled to the other lead of the resistor and to the output of the second operational amplifier; and a capacitor coupled between the non-inverting input of the second operational amplifier and ground.

9. A circuit for compensating a negative input signal for an offset from a reference level, the circuit comprising:

a maximum sense-and-hold circuit having an input and an output, the maximum sense-and-hold circuit sampling a portion of the negative input signal from the input, determining a maximum value for the sampled portion of the negative input signal, and holding the maximum value for the sampled portion of the negative input signal as a compensation signal; and a correction circuit which removes the compensation signal from the positive input signal.

10. The circuit as set forth in claim 9 wherein the maximum sense-and-hold circuit comprises:

an operational amplifier configured as a voltage follower;

a diode with an anode coupled to an output of the voltage follower;

a capacitor coupled between a negative power supply and the cathode of the diode; and a resistor coupled in parallel to the capacitor.

11. The circuit as set forth in claim 10 wherein the resistor and the capacitor determine a time constant for the maximum sense-and-hold circuit, the time constant being larger than a width of a pulse in the negative input signal for one duty cycle.

12. The circuit as set forth in claim 9 wherein the correction circuit comprises an operational amplifier.

13. The circuit as set forth in claim 9 further comprising a buffer circuit coupled between the sense-and-hold circuit and the correction circuit.

14. The circuit as set forth in claim 13 wherein the buffer circuit comprises an operational amplifier configured as a non-inverting voltage follower.

15. The circuit as set forth in claim 9 further comprising a gain adjustment circuit coupled to the input of the correction circuit.

16. A circuit for compensating an input signal for an offset from a reference level, the circuit comprising:

a sense-and-hold circuit having an input and an output, the sense-and-hold circuit sampling a portion of the input signal, determining an offset with respect to the reference level for the sampled portion of the input signal, holding the offset as a compensation signal; and a correction circuit removes the compensation signal from the input signal.

17. The circuit as set forth in claim 16 wherein the input signal is a positive input signal and the sense-and-hold circuit senses and holds a minimum value of the sampled portion of the positive input signal.

18. The circuit as set forth in claim 16 wherein the input signal is a negative input signal and the sense-and-hold circuit senses and holds a maximum value of the sampled portion of the negative input signal.

19. The circuit as set forth in claim 16 wherein the correction circuit comprises an operational amplifier.

20. The circuit as set forth in claim 19 further comprising a buffer circuit coupled between the sense-and-hold circuit and the correction circuit.

21. The circuit as set forth in claim 16 further comprising a gain adjustment circuit coupled to the input of the correction circuit.

* * * * *